US010879453B2

(12) United States Patent
Åkerman et al.

(10) Patent No.: US 10,879,453 B2
(45) Date of Patent: Dec. 29, 2020

(54) SPIN OSCILLATOR DEVICE AND MUTUALLY SYNCHRONIZED SPIN OSCILLATOR DEVICE ARRAYS

(71) Applicant: Johan Åkerman AB, Sollentuna (SE)

(72) Inventors: Johan Åkerman, Sollentuna (SE);
Ahmad A Awad, Gothenburg (SE);
Philipp Dürrenfeld, Gothenburg (SE);
Afshin Houshang, Gothenburg (SE);
Mykola Dvornik, Gothenburg (SE)

(73) Assignee: Nanosc AB, Kista (SE)

( * ) Notice: Subject to any disclaimer, the term of this patent is extended or adjusted under 35 U.S.C. 154(b) by 0 days.

(21) Appl. No.: 16/346,652

(22) PCT Filed: Oct. 27, 2017

(86) PCT No.: PCT/SE2017/051057
§ 371 (c)(1),
(2) Date: May 1, 2019

(87) PCT Pub. No.: WO2018/084774
PCT Pub. Date: May 11, 2018

(65) Prior Publication Data
US 2019/0280191 A1   Sep. 12, 2019

(30) Foreign Application Priority Data

Nov. 2, 2016  (SE) .................................. 1651446

(51) Int. Cl.
*H01L 43/06* (2006.01)
*H01L 43/08* (2006.01)
(Continued)

(52) U.S. Cl.
CPC ........... *H01L 43/06* (2013.01); *H01F 10/329* (2013.01); *H01F 10/3254* (2013.01);
(Continued)

(58) Field of Classification Search
CPC ..... H01L 43/06; H01L 43/08; H01F 10/3254; H01F 10/329; H03B 15/006
See application file for complete search history.

(56) References Cited

U.S. PATENT DOCUMENTS 7,608,975 B2 * 10/2009 Orlando ................. H01F 21/08
                                                  310/311
7,742,333 B2 *  6/2010 Lee ......................... G11C 11/18
                                                   365/170
(Continued)

FOREIGN PATENT DOCUMENTS

WO   2015/102739 A2    7/2015
WO   2015/195122 A1   12/2015

OTHER PUBLICATIONS

International Search Report and Written Opinion for corresponding Patent Application No. PCT/SE2017/051057 dated Dec. 20, 2017.
(Continued)

*Primary Examiner* — Ida M Soward
(74) *Attorney, Agent, or Firm* — Renner, Otto, Boisselle & Sklar, LLP

(57) ABSTRACT

A spin oscillator device including a first spin Hall effect nano-oscillator, SHNO, having an extended multilayered magnetic thin-film stack, wherein a nano-constriction, NC, is provided in the magnetic film stack providing an SHNO including a magnetic free-layer and a spin Hall effect layer, and having a nanoscopic region, wherein the NC is configured to focus electric current to the nanoscopic region, configured to generate the necessary current densities needed to excite magnetization auto-oscillations, MAO, in the magnetic free layer, wherein a circumferential magnetic field surrounds the NC, wherein an externally applied field with a substantial out-of-plane component is configured to control the spatial extension of the MAO towards a second
(Continued)

spin oscillator device, which is arranged in MAO communication and synchronized to the first NC.

12 Claims, 9 Drawing Sheets

(51) Int. Cl.
H01F 10/32 (2006.01)
H03B 15/00 (2006.01)
B82Y 25/00 (2011.01)

(52) U.S. Cl.
CPC .......... H01L 43/08 (2013.01); H03B 15/006 (2013.01); *B82Y 25/00* (2013.01)

(56) References Cited

U.S. PATENT DOCUMENTS

| | | | | |
|---|---|---|---|---|
| 8,063,709 | B2* | 11/2011 | Firastrau | B82Y 25/00 331/3 |
| 8,525,601 | B2* | 9/2013 | Lee | H03B 15/006 257/421 |
| 8,535,952 | B2* | 9/2013 | Ranjan | G11C 11/16 438/3 |
| 8,802,451 | B2* | 8/2014 | Malmhall | B82Y 10/00 438/3 |
| 9,159,909 | B2* | 10/2015 | Xue | H01B 17/005 |
| 9,425,738 | B2* | 8/2016 | Wang | G11C 11/161 |
| 9,543,894 | B2* | 1/2017 | Akerman | H01F 10/329 |
| 9,577,653 | B2* | 2/2017 | Buhrman | H03L 7/26 |
| 9,602,102 | B2* | 3/2017 | Kondo | H03K 19/0008 |
| 9,691,458 | B2* | 6/2017 | Ralph | H01F 10/3263 |
| 9,830,966 | B2* | 11/2017 | Mihajlovic | G11C 11/161 |
| 9,947,382 | B2* | 4/2018 | Buhrman | H01L 43/08 |
| 10,008,248 | B2* | 6/2018 | Buhrman | H01L 29/66984 |
| 10,305,026 | B2* | 5/2019 | Apalkov | H01L 43/10 |
| 10,320,404 | B2* | 6/2019 | Manipatruni | H01F 10/329 |
| 10,333,058 | B2* | 6/2019 | Aradhya | H01L 43/065 |
| 2016/0149124 | A1* | 5/2016 | Guo | G11C 11/18 438/3 |
| 2019/0081236 | A1* | 3/2019 | Camsari | G11C 11/161 |

OTHER PUBLICATIONS

T. Kendziorczyk and T. Kuhn, "Mutual synchronization of nanoconstriction-based spin Hall nano-oscillators through evanescent and propagating spin waves", Physical Review B, vol. 93, 134413 (Apr. 11, 2016); abstract; figures 1-3; sections I-II and V.

A. Giordano et al., "Spin-Hall nano-oscillator: a study based on the synchronization", 2015 IEEE Magnetics Conference (INTERMAG), Beijing, 2015. doi:10.1109/INTMAG.2015.7156649; whole document.

A. Giordano et al., "Spin-Hall nano oscillator: a micromagnetic study", Applied Physics Letters, vol. 105, 042412 (2014); abstract; figure 1.

V.E. Demidov et al., "Synchronization of spin Hall nano-oscillators to external microwave signals", Nature Communications, vol. 5, 3179 (2014); abstract; p. 1.

A.A. Awad et al., "Long-range mutual synchronization of spin Hall nano-oscillators", Nature Physics, vol. 13, 292 (2017) [published online Nov. 14, 2016]; whole document.

* cited by examiner

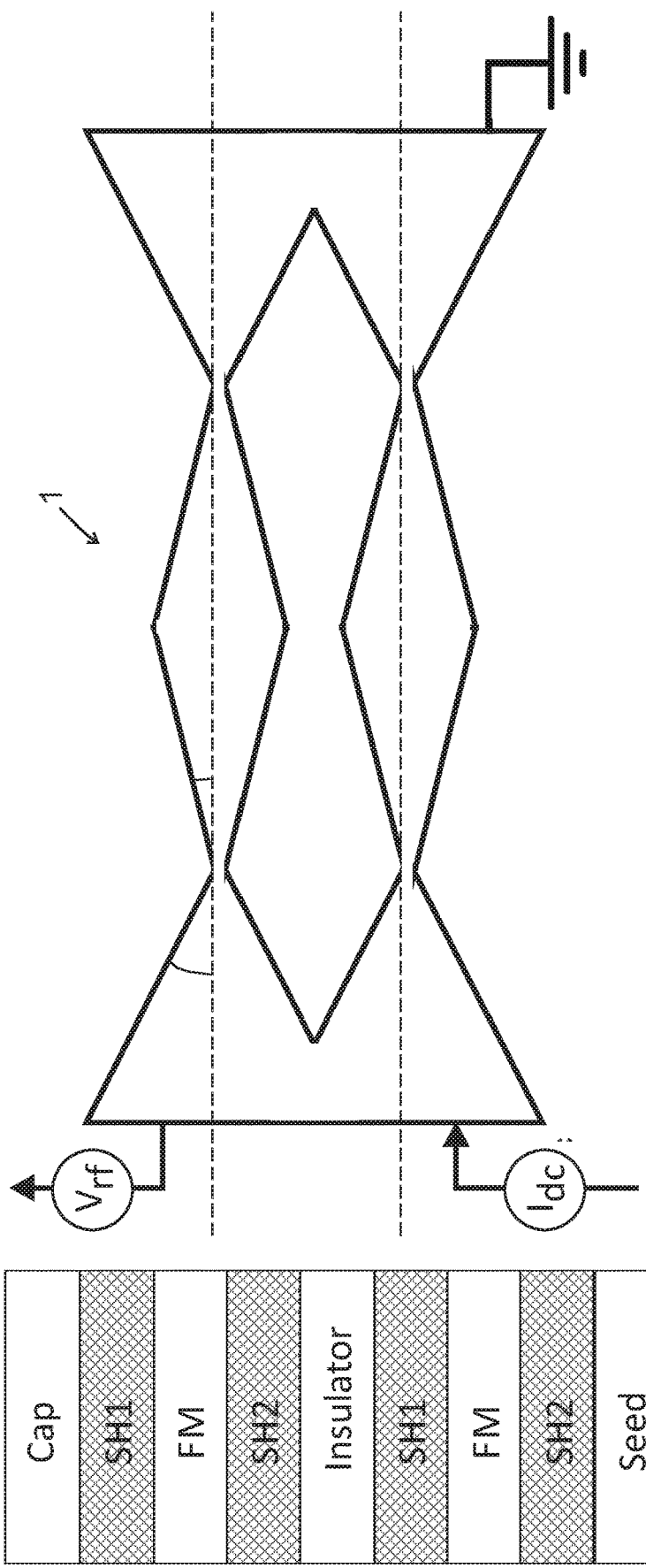

SPIN OSCILLATOR DEVICE AND MUTUALLY SYNCHRONIZED SPIN OSCILLATOR DEVICE ARRAYS

TECHNICAL FIELD

The present invention is directed to a spin oscillator device, and use of such a device.

BACKGROUND

Spin oscillator devices, such as spin Hall effect nano-oscillators (SHNO:s) that utilize spin currents are known.

A spin current can transfer its angular momentum to the magnetization of a thin film in a process known as spin transfer torque. A spin current can be generated from a charge current via the spin Hall effect. At large enough spin current densities, which can be obtained by passing the charge current through a nano-constriction (NC), the intrinsic damping of the magnetic thin film can be fully compensated and auto-oscillations of the magnetization can be sustained.

Such intrinsically nanoscale devices are attractive candidates for applications where a highly tunable broad-band oscillator is needed. However, the low output power and high phase noise of the oscillator has stalled their progress. A generally accepted technique to improve oscillator performance has been to synchronize many of them together.

Beyond oscillator technology, such devices have other potential uses. For example, while complementary metal-oxide semiconductor (CMOS) integrated circuits have been the prior art technology in data processing, one such "beyond CMOS" technology relies on the functionalization of both propagating and localized spin waves, a sub-field within spintronic generally called magnonics. The typical components of a magnonic device include a mechanism to generate, manipulate, and detect spin waves as well as a magnetic medium for the spin waves to travel or interact in. An extension of these technologies is to utilize massively parallel networks of spintronic oscillators for neuromorphic functions that aim to mimic the functionality found in the human brain. It is therefore crucial to develop new techniques to manipulate and reliably control spin waves and magnetization auto-oscillations on the nanoscale. Additionally, due to damping and losses within the ferromagnetic medium there is a finite propagation length of the propagating spin waves and finite interaction length between weakly localized spin waves. It is also technologically advantageous to increase the range of spin wave propagation and interaction such that information can be transported over greater distances.

The synchronization and phase locking of coupled non-linear oscillators is a common natural phenomenon. The coupling is typically described as mutual since each oscillator plays an active role in the resulting synchronized state. Mutual synchronization is considered the primary vehicle to achieve sufficient signal quality required for applications. It is also a key mechanism for neuromorphic functionality in oscillator networks. However, so far mutual synchronization of SHNOs have not been experimentally demonstrated.

SUMMARY OF THE INVENTION

According to an aspect of the present disclosure, interacting localized spin waves are the dominant coupling mechanism giving rise to synchronization. Furthermore, by operating the SHNO in an out-of-plane field, instead of the commonly used in-plane field, the localized nature of the auto-oscillating region can be reduced and the auto-oscillating region can expand in size. At certain unique combinations of out-of-plane magnetic field and SHNO drive current, the out-of-plane magnetization direction and the intrinsic non-linearity of the oscillator combine to detach the local maximum of oscillation from the side of the NC to the interior of the NC. After this detachment, the auto-oscillating region can expand substantially in size, which both increases the microwave output power of a single SHNO and enables robust mutual synchronization of two or more SHNOs.

According to a first embodiment of the first aspect, there is provided a spin oscillator device comprising a first spin Hall effect nano-oscillator (SHNO) having an extended bilayered magnetic and non-magnetic thin-film stack, wherein a nano-constriction (NC) is provided in the bilayer thin film stack providing an SHNO comprising a magnetic free-layer and having a nanoscopic region. The NC is configured to focus electric current to the nanoscopic region, configured to generate the necessary current densities needed to generate auto-oscillating spin waves in the magnetic free layer. An externally applied field is configured to control the direction of the free layer magnetization such that it forms a non-zero out-of-plane angle with the film-plane to make the spin wave region detach from the NC edge and expand into and out of the NC region towards a second spin oscillator device, also auto-oscillating, and synchronized to the first NC.

According to an aspect, by daisy-chaining multiple NCs in a vertical array geometry, one can propagate spin wave information (that is spin wave phase, frequency, amplitude, and their modulation) from one NC to another NC over much larger distances than would be allowed by a single NC. This is technologically advantageous, since it allows localized spin waves to transmit information over distances much greater than their intrinsic localization. This increases the range of spin-waves such that information can be transported over greater distances.

According to an aspect, by tailoring the bridge, for instance by narrowing the bridge connecting two or more spin oscillators the spin current density in the bridge can be increased and the spin wave damping can be reduced to further expand the oscillating region into the bridge so as to increase the interaction between spin oscillators. This further increases the distances over which two or more spin oscillators can be mutually synchronized.

According to an aspect, by placing two or more lines of two or more spin oscillators next to each other, dipolar coupling can make spin oscillators in neighboring lines mutually synchronize, making entire two-dimensional lateral arrays of spin oscillators possible to mutually synchronize.

According to an aspect, by fabricating two or more lines of two or more spin oscillators on top of each other, dipolar coupling can make spin oscillators in neighboring lines mutually synchronize, making entire two-dimensional arrays of spin oscillators possible to mutually synchronize. Similarly, by fabricating two or more lateral arrays of spin oscillators on top of each other, entire three-dimensional arrays of spin oscillators can be made to mutually synchronize.

According to an aspect, a number of spin oscillators, typically with different frequencies, either from geometrical or material differences, are connected in parallel such that they have individual drive currents but their microwave signals are combined together. On top of the ensemble of spin oscillator is a conductor providing a microwave field with a frequency f. The frequency $f_i$ of each spin oscillator can be controlled independently. For a certain set of input currents $I_i$ to the ensemble of spin oscillators, all $f_i$ will be sufficiently close to f to injection lock. As the combined output signal of the ensemble of spin oscillators will increase strongly with the number of injection locked spin oscillators, the strength of this microwave signal can be used as a measure of how close the ensemble of oscillators has been tuned to f. The output signal will be the strongest for a certain set of input currents, and the ensemble of spin oscillators can hence be used to recognize this set. By tuning the microwave current strength through the conductor, the requirements on how close the frequencies $f_i$ must match f can also be tuned.

According to an aspect, a number of spin oscillators, typically with different frequencies, either from geometrical or material differences, are connected in series such that they have the same drive current but generate different frequencies $f_i$. On top of each spin oscillator is a conductor providing a static magnetic field to individually tune the frequency of that spin oscillator. The frequency $f_i$ of each spin oscillator can hence be controlled independently. For a certain set of input currents $I_i$ to the ensemble of conductors, all $f_i$ will be sufficiently close to each other to mutually synchronize. As the combined output signal of the ensemble of spin oscillators will increase strongly with the number of mutually synchronized spin oscillators, the strength of this microwave signal can be used as a measure of how close the ensemble of oscillators has been tuned to a common frequency. The output signal will be the strongest for a certain set of input currents to the conductors, and the ensemble of spin oscillators can hence be used to recognize this set. By tuning the current strength through the ensemble of spin oscillators, their interaction strength can be tuned and hence the requirements on how close the frequencies $f_i$ must match each other can also be tuned.

BRIEF DESCRIPTION OF THE DRAWINGS

The features and advantages of the present invention will become further apparent from the following detailed description and the accompanying drawing, of which:

FIG. 6a-b show a spin oscillator device according to an alternative embodiment of the invention in sectional view from the side (FIG. 6a) and in a principal top view (FIG. 6b) showing three-dimensional synchronization in two lateral directions and the normal direction.

DETAILED DESCRIPTION OF THE INVENTION

Embodiments of the present invention will be described as follows.

Figure 1B:
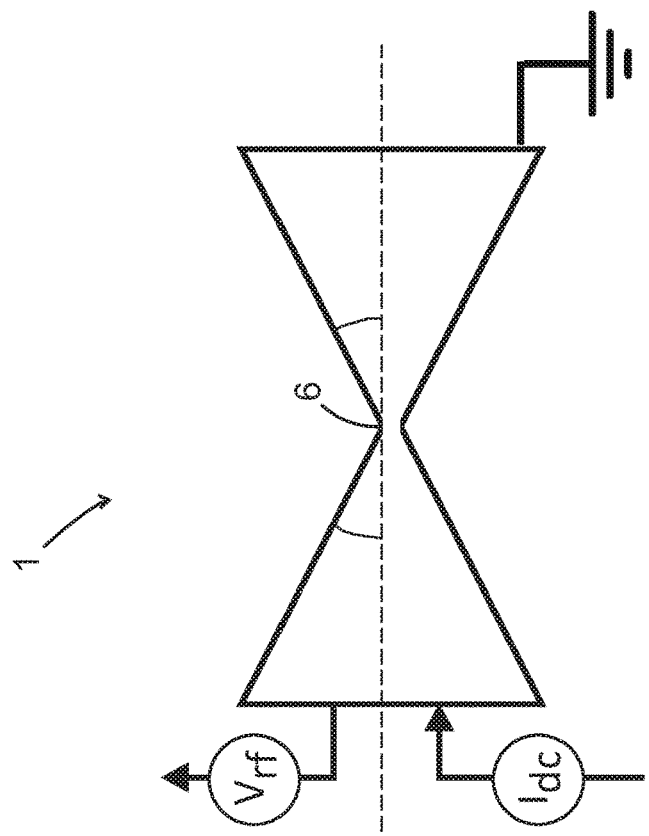
FIG. 1a-b show a spin oscillator device according to an embodiment of the invention in a sectional view from the side (FIG. 1a), illustrating the stacked layers, and in a top view (FIG. 1b), illustrating the nano-constriction as well as the current drive and the microwave voltage generation.
Figure 1A:
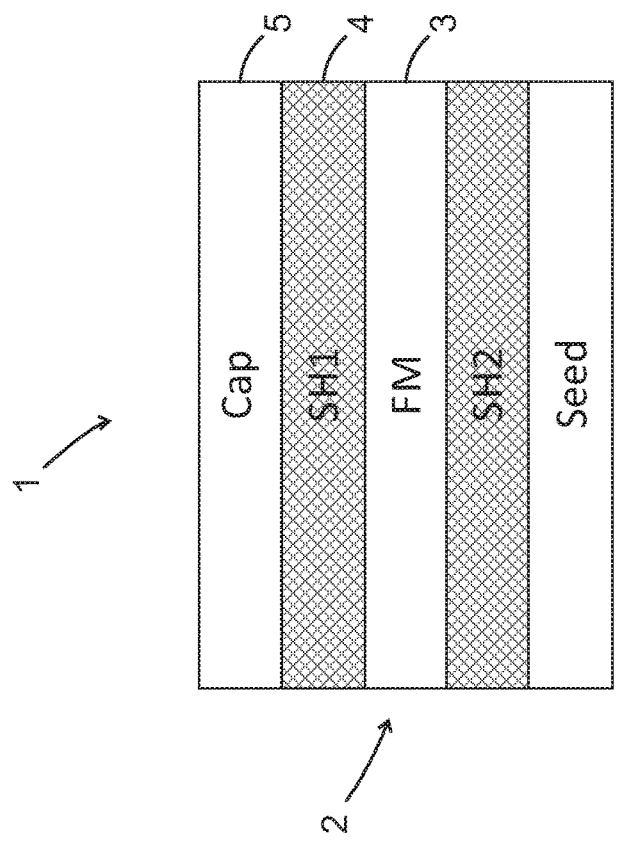

FIG. 1a-b show a spin oscillator device according to an embodiment of the invention.

The spin oscillator device 1 comprises a spin oscillator 2 having a magnetic layer, also referred to as a free layer, 3 and adjacent layers 4 and 5 providing spin currents into the magnetic layer via the spin Hall effect. The spin oscillator device 1, is configured to generate localized or propagating spin waves (SWs). The spin oscillator 2 is configured to be controlled by means of injecting current $I_{dc}$, and/or applying magnetic fields. In this embodiment, the spin oscillator 2 is a spin Hall effect nano-oscillator, SHNO, wherein a nano-constriction (NC) 6 is provided in layers 3, 4, and 5.

Typically, in operation, a charge current $I_{dc}$ is injected through the spin oscillator device 1, gets concentrated in the NC 6 and drives a spin current $I_s$ from layers 4 and 5 into the magnetic layer 3. In the alternative embodiment where both layers 4 and 5 are missing, an intrinsic spin current is driven in the NC region via the current passing through the inhomogenous magnetization. Typically, the spin Hall angles of layers 4 and 5 are chosen to have opposite signs so as to make their individual spin currents add up constructively in the magnetic layer 3. The net sum of all spin currents excites oscillations of the magnetization in layer 3. These oscillations generate localized or propagating spin waves in the free layer 3 that propagate or extend away from the NC 6.

Alternatively the spin oscillator 2 can have one or both of the layers 4 or 5 omitted.

Alternatively, the free layer 3, can be a composite layer, and/or multilayer, where different magnetic and non-magnetic materials are combined to tailor their magnetic properties such as, but not limited to, magnetization strength and direction, magnetic anisotropy strength and direction, spin wave damping, spin polarization, and magnetoresistance.

The spin oscillator 2 generates an output signal $V_{rf}$ through a magneto resistive effect such as anisotropic magnetoresistance, giant magnetoresistance, or tunneling magnetoresistance, or a combination thereof.

Now is referred to FIGS. 1a and 1b. FIG. 1a and FIG. 1b show a spin oscillator device 1 in a perspective view from a side and above, illustrating typical stacked layers and nano-constriction as non-limiting examples.

FIGS. 1a and 1b show a spin Hall effect nano-oscillator (SHNO) device 1 architecture as shown in FIG. 1. A lithographically defined nano-constriction 6 in layers 3, 4, and 5, typically symmetric and from 5 to 500 nm in width, with radius of curvature typically in the same range, with an opening angle from 0 to 90 degrees, acts to focus the electric current $I_{dc}$ to a nanoscopic region. Such focusing of the electric current $I_{dc}$ generates the necessary spin current densities needed to excite spin waves in the free layer 3. Along with the electrical current $I_{dc}$ which passes through the nano-constriction NC 6, there is a circumferential magnetic field, called an Oersted field ($H_{Oe}$) that results in both in-plane and out-of-plane field components in the NC 6. If an externally applied field ($H_{ext}$) has an out-of-plane component that is constant across the width of the NC 6, then the net effect of the Oersted field is a non-uniform total field with a field minimum at one of the edges of the NC 6.

As explained, according to an aspect of the present invention, a unique combination of the NC 6 geometry, the Oersted field, and the externally applied magnetic field provide that auto-oscillations at low currents will start at the edge of the NC 6 with the lowest total magnetic field. Under the influence of the non-linearity of the auto-oscillation there exists a current value above which the maximum of the auto-oscillation will detach from the edge and move inside the NC 6. Accompanied by this detachment is an expansion of the auto-oscillating region both through the NC 6 and in both directions outside of the NC 6.

Figure 2:
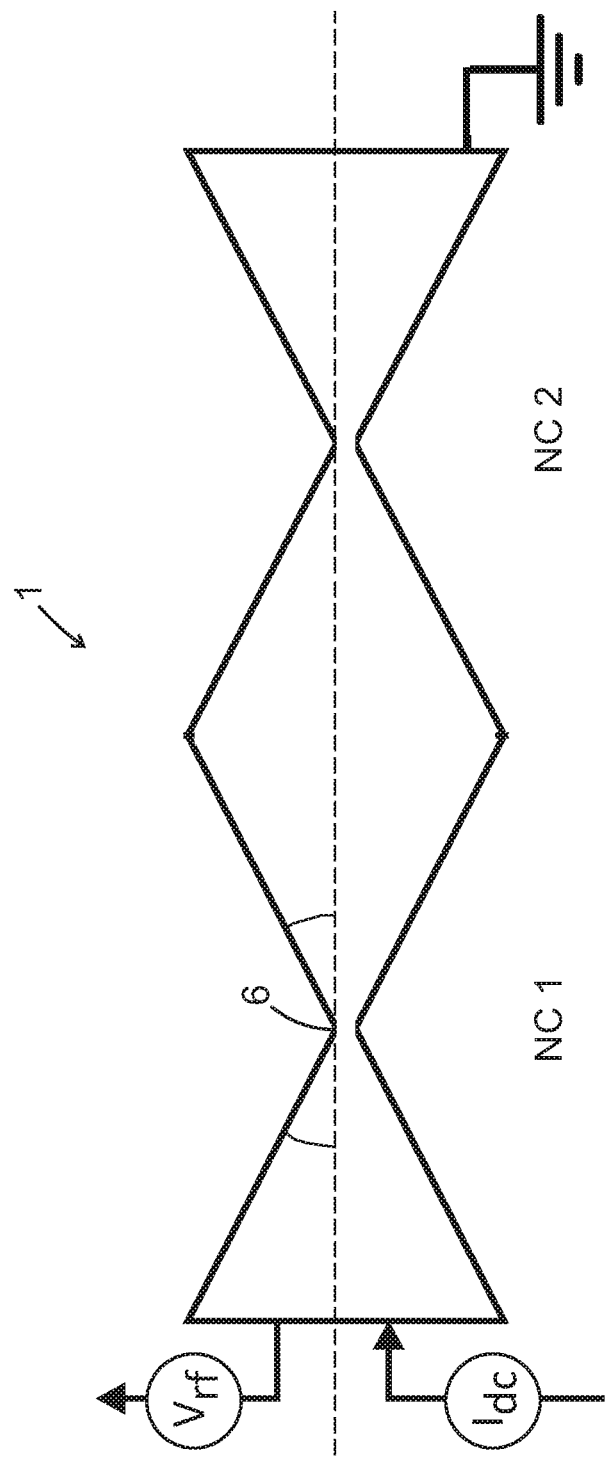
FIG. 2 shows a spin oscillator device according to an embodiment of the invention in a principal top view showing mutual synchronization.

Now is referred to FIG. 2, which shows two spin oscillator devices according to an embodiment of the invention in a principal view showing mutual synchronization.

An externally applied field ($H_{ext}$) with an out-of-plane component is configured to control the auto-oscillations in the two nano-constrictions NC1 and NC2. The two NCs differ either in geometry (e.g width, curvature, opening angle), either through natural processing variations or intentionally by design. The different geometries will typically result in different auto-oscillating frequencies in NC1 and NC2, denoted f1 and f2. Under the combination of a drive current $I_{dc}$ and the externally applied field ($H_{ext}$) the auto-oscillating regions can expand sufficiently to result in direct interaction between the auto-oscillating regions and eventually mutual synchronization of the auto-oscillations such that f1=f2.

Figure 3:
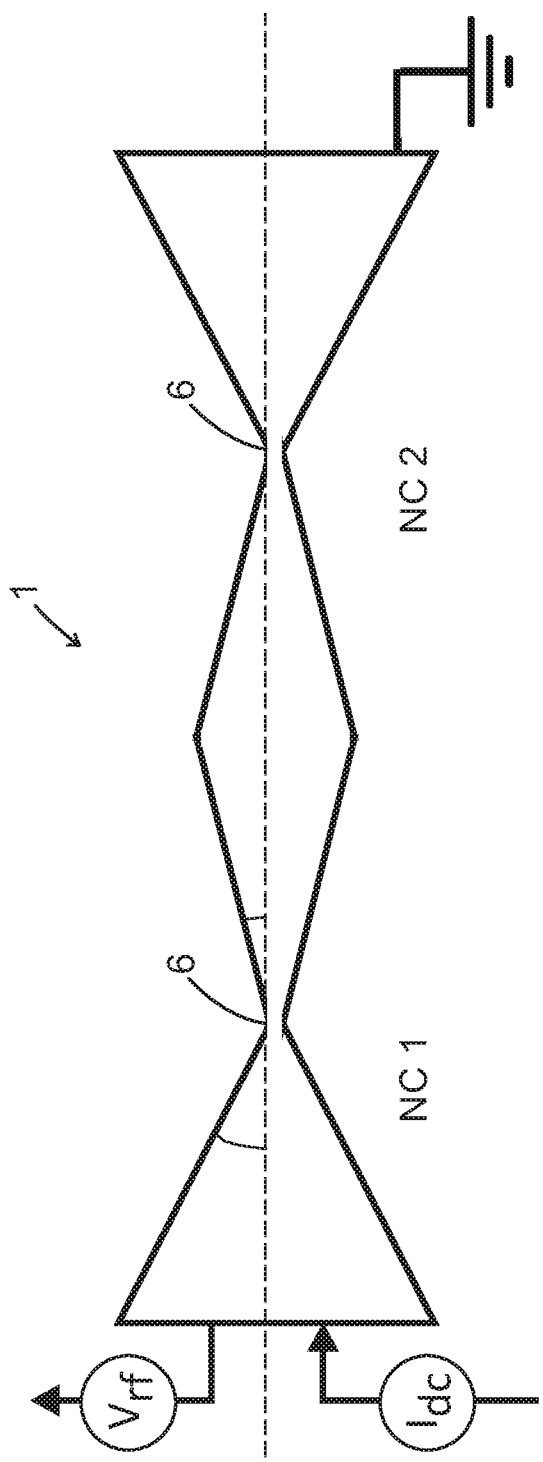
FIG. 3 shows a spin oscillator device according to an embodiment of the invention in a principal top view showing enhanced mutual synchronization.

Now is referred to FIG. 3, which shows two spin oscillator devices NC1, NC2 according to an embodiment of the invention in a principal view showing mutual synchronization over large distances.

The opening angle of the bridge connecting NC1 and NC2 can be varied from 0 to 90 degrees, where 0 degrees implies a uniform nanowire with the same width as NC1 and NC2, and 90 degrees implies a quasi-infinite wide bridge. In a typical embodiment to achieve mutual synchronization over large distances, the opening angle is a few degrees such that the current density in the bridge is high but lower than that inside NC1 and NC2. In this way auto-oscillations will start in NC1 and NC2 but as the current increases, the auto-oscillating regions will extend further into the bridge, which significantly promotes mutual synchronization over large distances.

The embodiment in FIG. 3 can be naturally extended to more than 2 nano-constrictions, such that a line of N nano-constrictions of different widths and curvature are connected by bridges of different lengths and opening angles. In a typical embodiment, all NCs are nominally similar and all bridges are nominally similar, with the exception of natural processing variations. Through a combination of external applied field and drive current through the line of NCs, a partially or fully synchronized state of NCs can be achieved. This chain of oscillators can be extended indefinitely. Thus, in principle an infinite number of oscillators can be daisy-chained.

Figure 4:
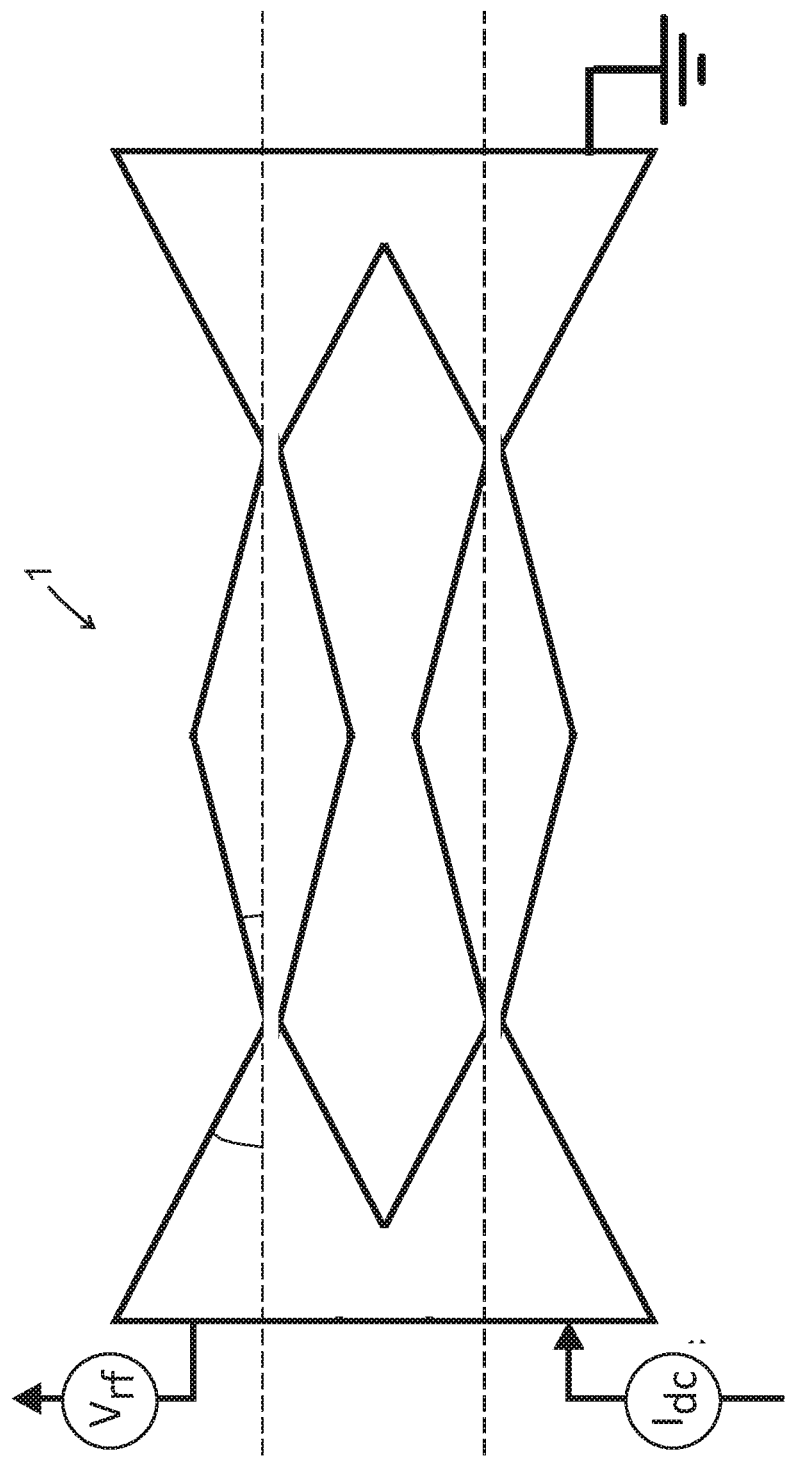
FIG. 4 shows a spin oscillator device according to an alternative embodiment of the invention in a principal top view showing two-dimensional synchronization in two lateral directions.

Now is referred to FIG. 4, where two lines, each having two nano-constrictions, are placed next to each other to form a lateral two-dimensional array. A combination of external magnetic field and drive current through the array can now promote mutual synchronization of neighboring lines via magnetostatic coupling between auto-oscillating regions. In this way a partially or fully mutually synchronized two-dimensional array of auto-oscillating regions can be realized.

The embodiment in FIG. 4 can be naturally extended to more than two lines and to each line having more than two nano-constrictions, such that a lateral two-dimensional array of N times M nano-constrictions is realized. Through a combination of external applied field and drive current through the lines of NCs, a partially or fully synchronized state of NCs can be achieved. This array of oscillators can be extended indefinitely. Thus, in principle an infinite number of oscillators can be daisy-chained in two dimensions.

Figures 5A, 5B:
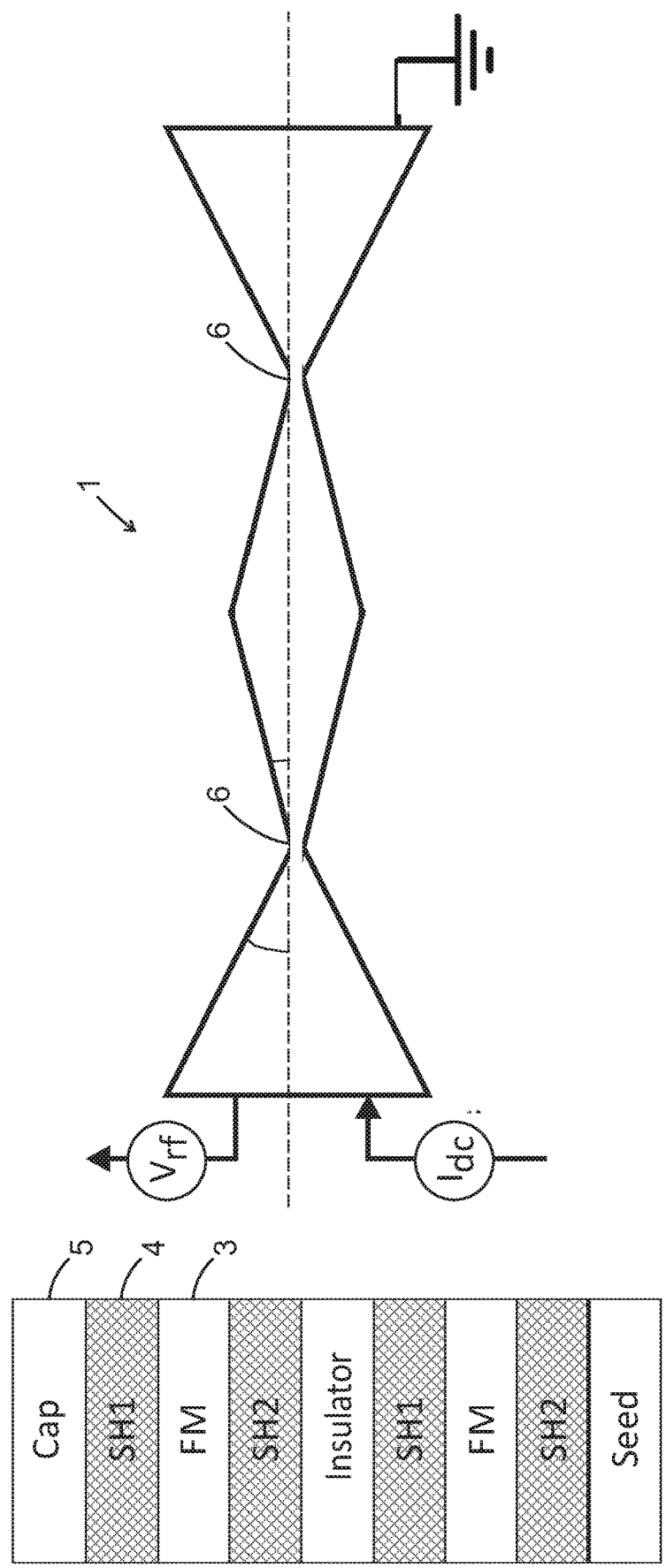
FIG. 5a-b show a spin oscillator device according to an alternative embodiment of the invention in a sectional view from the side (FIG. 3a) and in a principal top view (FIG. 3b) showing two-dimensional synchronization in one lateral direction and the normal direction.

Now is referred to FIG. 5a-b, where two nano-constrictions are placed on top of each other to for a two-dimensional array extending along the line and into the direction perpendicular to the plane of the constituent layers. A combination of external magnetic field and drive current through the array can now promote mutual synchronization of neighboring lines via magnetostatic coupling between auto-oscillating regions. In this way a partially or fully mutually synchronized two-dimensional array of auto-oscillating regions can be realized.

The embodiment in FIG. 5a-b can be naturally extended to more than two nano-constrictions 6 in the direction perpendicular to the plane and to each line having more than two nano-constrictions, such that a two-dimensional array of N times M nano-constrictions is realized. This array of oscillators can be extended indefinitely. Thus, in principle an infinite number of oscillators can be daisy-chained in two dimensions, where one dimension is perpendicular to the plane of the device.

Now is referred to FIG. 6, where two two-dimensional arrays 10 of two lines, each having two nano-constrictions, are placed on top of each other two form a three-dimensional array 10 extending both laterally and into the direction perpendicular to the plane of the constituent layers. A combination of external magnetic field and drive current through the array can now promote mutual synchronization. In this way a partially or fully mutually synchronized three-dimensional array of auto-oscillating regions can be realized.

The embodiment in FIG. 6 can be naturally extended to more than two two-dimensional arrays in the direction perpendicular to the plane and to each array having more than two lines having more than two nano-constrictions 6, such that a three-dimensional array 10 of N times M times P nano-constrictions is realized. This array 10 of oscillators can be extended indefinitely. Thus, in principle an infinite number of oscillators can be daisy-chained in three dimensions.

Figure 7B:
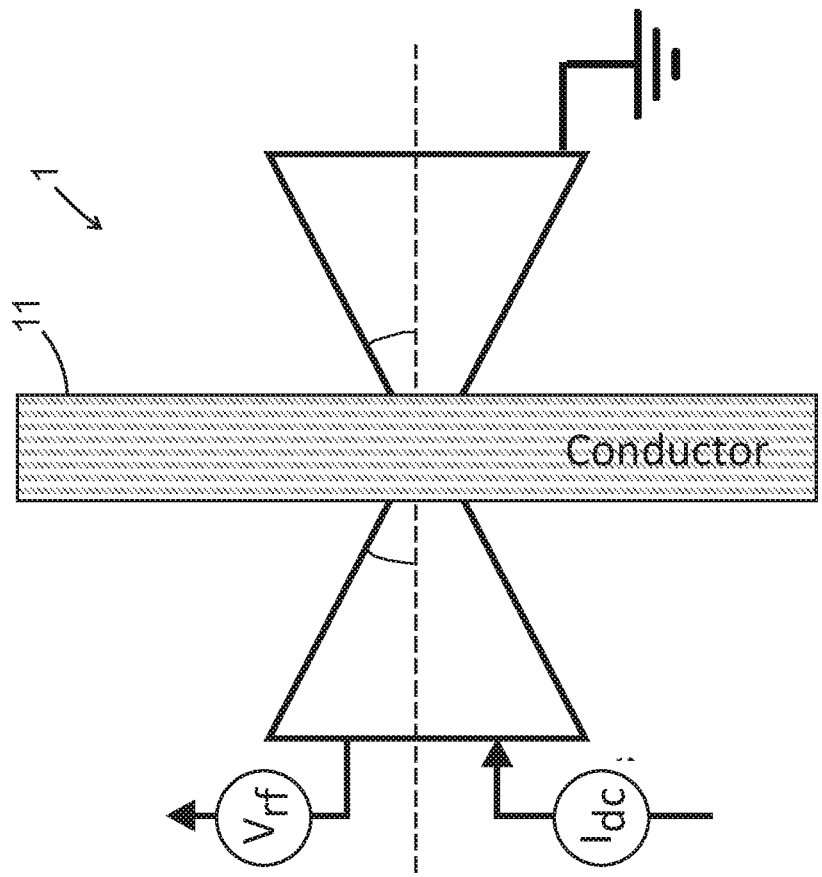
FIG. 7a-b show a spin oscillator device, according to an alternative embodiment of the invention in sectional view from the side (FIG. 6a) and in a top view (FIG. 6b), with a nearby conducting line providing a combination of static and microwave magnetic field with a frequency different from the spin oscillator. The spin oscillator can be injection locked to the frequency of the microwave magnetic field.
Figure 7A:
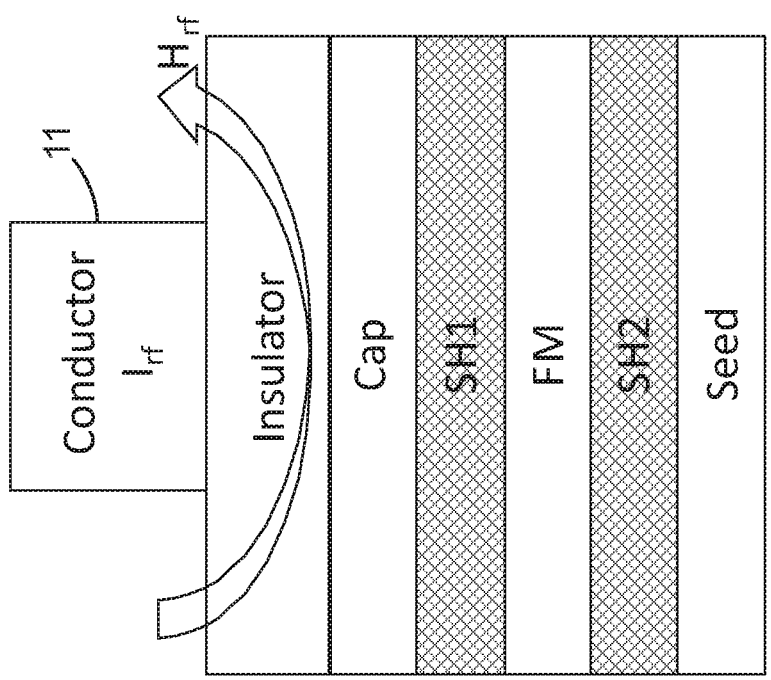

Now is referred to FIG. 7 where a conductor 11 is located on top of the spin oscillator. The conductor 11 can provide a combination of static and microwave magnetic field. The static field can be used to tune the frequency of the spin oscillator. The microwave field can injection lock the frequency of the spin oscillator.

Figure 8:
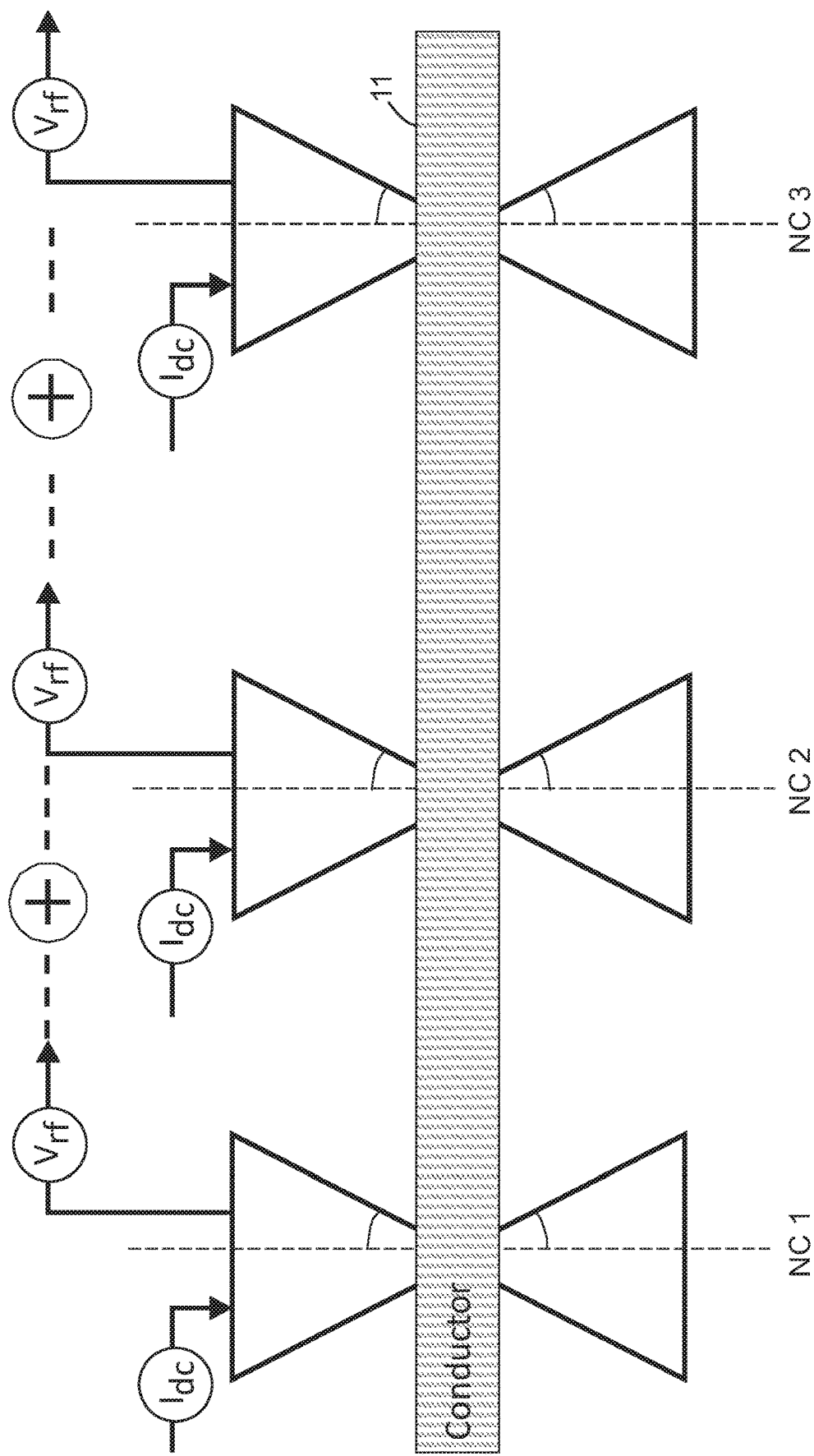
FIG. 8 shows according to an alternative embodiment of the invention in a top view a linear parallel array of spin oscillator devices with an additional line providing a microwave field with a single frequency. Each spin oscillator can be driven individually with a current that controls each oscillator frequency. The microwave signal from each spin oscillator is combined together. When all input currents are such that the individual frequencies are close to the microwave field frequency, all oscillators will injection lock to this frequency, providing a large coherent microwave output voltage when combined.

Now is referred to FIG. 8 where a number of spin oscillators NC1, NC2, NC3, typically with different frequencies, either from geometrical or material differences, are connected in parallel such that they have individual drive currents but their microwave signals are combined together. On top of the ensemble of spin oscillator is a conductor 11 providing a microwave field with a frequency f. The frequency $f_i$ of each spin oscillator can be controlled independently. For a certain set of input currents $I_i$ to the ensemble of spin oscillators, all $f_i$ will be sufficiently close to f to injection lock. As the combined output signal of the ensemble of spin oscillators will increase strongly with the number of injection locked spin oscillators, the strength of this microwave signal can be used as a measure of how close the ensemble of oscillators has been tuned to f. The output signal will be the strongest for a certain set of input currents, and the ensemble of spin oscillators can hence be used to recognize this set. By tuning the microwave current strength through the conductor, the requirements on how close the frequencies $f_i$ must match f can also be tuned.

Figures 9A, 9B:
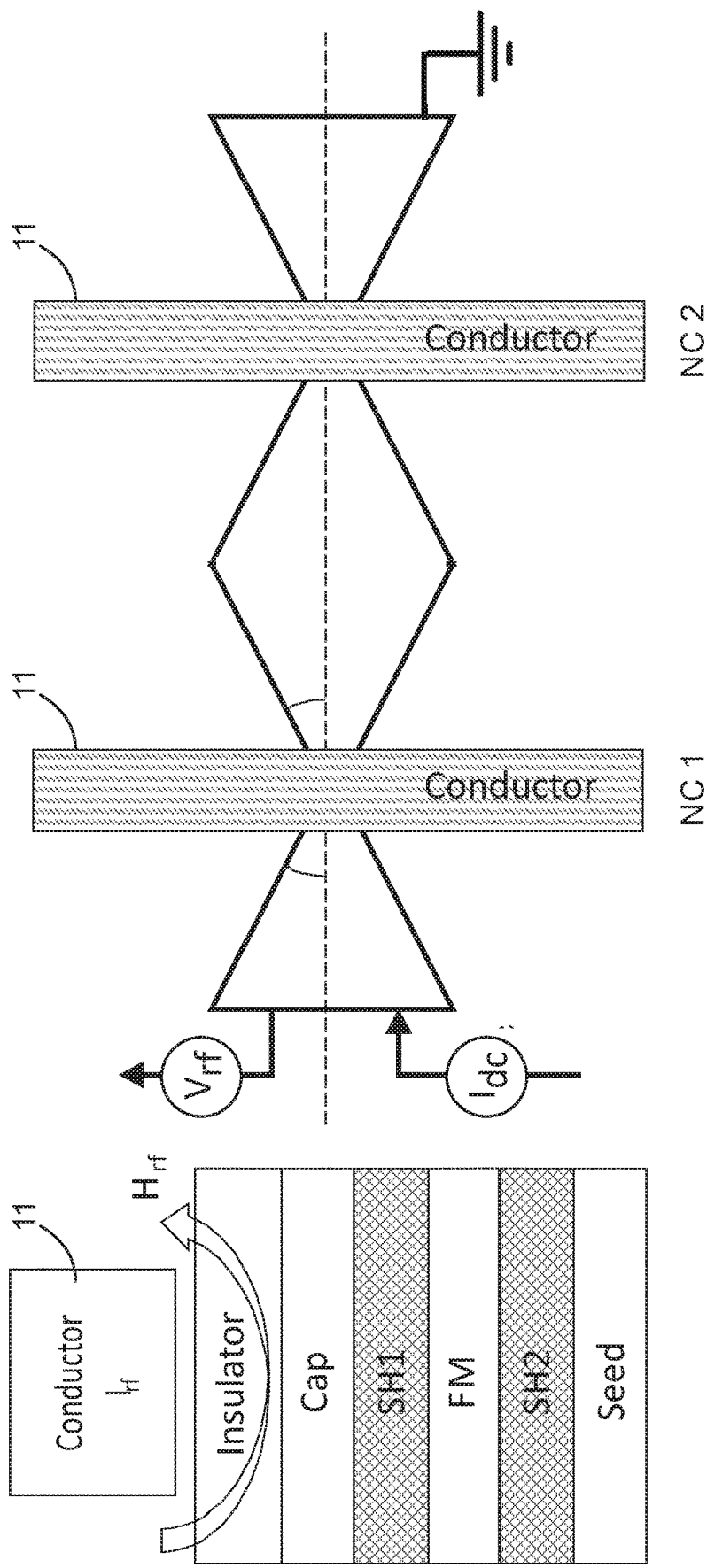
FIG. 9a-b show according to an alternative embodiment of the invention in sectional view from the side (FIG. 9a) and in a top view (FIG. 9b), a linear serial array of spin oscillator devices each having an additional line providing an additional dc magnetic field. The spin oscillators are designed such that without an additional field, they oscillate on different enough frequencies that they do not mutually synchronize. When the additional magnetic fields are such that the individual frequencies are close to each other, all oscillators will injection lock to a single joint frequency, providing a large coherent microwave output voltage when combined.

Now is referred to FIG. 9 where a number of spin oscillators NC1, NC2, typically with different frequencies, either from geometrical or material differences, are connected in series such that they have the same drive current but generate different frequencies $f_i$. On top of each spin oscillator is a conductor providing a static magnetic field to individually tune the frequency of that spin oscillator. The frequency $f_i$ of each spin oscillator can hence be controlled independently. For a certain set of input currents $I_i$ to the ensemble of conductors 11, all $f_i$ will be sufficiently close to each other to mutually synchronize. As the combined output signal of the ensemble of spin oscillators will increase strongly with the number of mutually synchronized spin oscillators NC1, NC2, the strength of this microwave signal can be used as a measure of how close the ensemble of oscillators has been tuned to a common frequency. The output signal will be the strongest for a certain set of input currents to the conductors, and the ensemble of spin oscillators can hence be used to recognize this set. By tuning the current strength through the ensemble of spin oscillators, their interaction strength can be tuned and hence the requirements on how close the frequencies $f_i$ must match each other can also be tuned.

Alternatively, the conductor 11 can be used to provide a voltage to each nano-constriction to tune the local magnetic ansisotropy via the voltage controlled anisotropy effect, and hence the frequency of the nano-constriction, instead of via the magnetic field.

According to an aspect, the devices can alternatively be based on magnetic tunnel junctions.

The foregoing detailed description is intended to illustrate and provide easier understanding of the invention, and should not be construed as limitations. Alternative embodiments will become apparent to those skilled in the art without departing from the spirit and scope of the present invention.

The invention claimed is:

1. A spin oscillator device comprising a first spin Hall effect nano-oscillator, SHNO, having an extended multilayered magnetic thin-film stack, wherein a nano-constriction, NC, is provided in said magnetic film stack providing an SHNO comprising a magnetic free-layer and a spin Hall effect layer, and having a nanoscopic region, wherein the NC is configured to focus electric current ($I_{dc}$) from an external source to the nanoscopic region, configured to generate the necessary current densities needed to excite magnetization auto-oscillations, MAO, in the magnetic free layer, wherein a circumferential magnetic field ($H_{Oe}$) surrounds the NC, wherein an externally applied field ($H_{ext}$) with a substantial out-of-plane component is configured to control the spatial extension of the MAO towards a second spin oscillator device (NC2), which is arranged in MAO communication and synchronized to the first NC (NC1).

2. The spin oscillator device according to claim 1, wherein at least a second NC (NC2) having a second frequency is arranged laterally stacked with respect to the first NC (NC1) in MAO communication and synchronized to the first NC (NC1) having a first frequency ($f_1$), wherein the second frequency $f_2 = f_1$.

3. The spin oscillator according to claim 2, wherein at least three NCs (NC2, NC3, NC4) having a second, third and fourth frequency, respectively are arranged, daisy-chained, laterally arranged with respect to the first NC (NC1) in MAO communication and synchronized to the first NC (NC1) having a first frequency ($f_1$), wherein the second frequency $f_2$, the third frequency $f_3$ and the fourth frequency $f_2 = f_3 = f_4 = f_1$.

4. The spin oscillator device according to claim 1, wherein a region connecting two NCs is tailored in width to further extend the MAO into the connecting region and increase the interaction strength between the two NCs.

5. The spin oscillator device according to claim 1, wherein a plurality of NCs are arranged in a linear chain, where all NCs can be made to synchronize with each other, and a plurality of such chains are arranged laterally to promote mutual synchronization of neighboring chains, realizing a 2D array of mutually synchronized NCs extending in the two lateral dimensions.

6. The spin oscillator device according to claim 1, wherein a plurality of NCs are arranged in a linear chain, where all NCs can be made to synchronize with each other, and a plurality of such chains are arranged vertically, on top of each other, to promote mutual synchronization of neighboring chains, realizing a 2D array of NCs extending in one lateral dimension and one vertical dimension.

7. The spin oscillator device according to claim 1, wherein a plurality of NCs are arranged in a linear chain, where all NCs can be made to synchronize with each other, and a plurality of such chains are arranged laterally to promote mutual synchronization of neighboring chains, realizing a 2D array of mutually synchronized NCs extending in the two lateral dimensions, and a plurality of such 2D arrays are arranged vertically, on top of each other, to promote mutual synchronization of neighboring 2D arrays, realizing a 3D array of NCs extending in the two lateral directions and the vertical dimension.

8. A plurality of different spin oscillator devices according to claim 1, wherein a conducting line is placed in proximity to the spin oscillator devices and providing a microwave magnetic field with a frequency f such that the spin oscillator devices can synchronize to the microwave magnetic field, wherein each spin oscillator has its individual current drive such that the frequency $f_i$ of each spin oscillator can be controlled individually and that for a given current level each $f_i$ can be different from the others, wherein the spin oscillator devices are designed such that for a certain unique set of drive currents, each $f_i$ is close enough to f such that most or all spin oscillator devices injection lock to the microwave magnetic field, wherein the individual microwave signals from each spin oscillator device are combined and for a unique set of drive currents, this combined microwave signal has a clear maximum, identifying a match between the input currents and the set of spin oscillator devices.

9. A plurality of different spin oscillator devices according to claim 1, wherein a line of spin oscillator devices each has an individual conducting line to either provide a local magnetic field or a local electric field such as to tune the frequency $f_i$ of the individual spin oscillator, wherein the spin oscillator devices are designed such that for a certain unique set of local magnetic or electric field, each $f_i$ is close enough to a common mutual frequency f such that most or all spin oscillator devices synchronize to this common single frequency, wherein the microwave signal from the chain of spin oscillator devices has a clear maximum, identifying a match between the input fields and the set of spin oscillator devices.

10. The spin oscillator device according to claim 1, wherein a plurality of NCs arranged laterally in a linear chain (NC1, NC2) are arranged to be tunable in width and stacked offset to each other to form a 2D array of NCs.

11. Use of a device according to claim 1 in one or more of: spintronic, magnonics, hard disk drives (reading head), micro wave signal generators and detectors or domain-wall devices.

12. Use of a device according to claim 7, wherein the spin oscillator devices are based on magnetic tunnel junctions.

* * * * *